(12) United States Patent
Wang et al.

(10) Patent No.: US 8,517,762 B1
(45) Date of Patent: Aug. 27, 2013

(54) ELECTRONIC DEVICE WITH CONNECTOR MODULE

(75) Inventors: Jun-Hui Wang, Shenzhen (CN); An-Gang Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/452,955

(22) Filed: Apr. 23, 2012

(30) Foreign Application Priority Data

Mar. 14, 2012 (CN) .......................... 2012 1 0066668

(51) Int. Cl.
*H01R 13/60* (2006.01)
(52) U.S. Cl.
USPC ........... 439/540.1; 439/65; 439/374; 361/729
(58) Field of Classification Search
USPC ................. 439/65, 61, 74, 374, 540.1, 541.5; 361/728–736
See application file for complete search history.

(56) References Cited

U.S. PATENT DOCUMENTS

| | | | |
|---|---|---|---|
| 4,899,254 A * | 2/1990 | Ferchau et al. | 361/695 |
| 6,154,361 A * | 11/2000 | Anderson et al. | 361/679.34 |
| 6,201,692 B1 * | 3/2001 | Gamble et al. | 361/679.31 |
| 7,453,706 B2 * | 11/2008 | Clark et al. | 361/796 |
| 7,804,690 B2 * | 9/2010 | Huang et al. | 361/724 |
| 8,054,619 B1 * | 11/2011 | Antosh | 361/679.31 |

* cited by examiner

*Primary Examiner* — Khiem Nguyen
(74) *Attorney, Agent, or Firm* — Altis Law Group, Inc.

(57) ABSTRACT

An electronic device includes a chassis including a bottom wall, a bracket fixed to the bottom wall, a data storage assembly received in the bracket, and a connector module. The connector module includes a main body and two mounting members. The mounting members are fixed to the chassis and the bracket. The main body is slidably arranged between the mounting members. The main body includes a first side surface and a second side surface, a first signal connector and a power connector are set on the first side surface, the first signal connector is to electrically connect with a motherboard of the electronic device, the power connector is to connect with a power supply, a plurality of second signal connectors are set on the second side surface, to electrically connect with the data storage assembly.

6 Claims, 5 Drawing Sheets

ELECTRONIC DEVICE WITH CONNECTOR MODULE

BACKGROUND

1. Technical Field

The present disclosure relates to an electronic device with connector modules.

2. Description of Related Art

A server includes a plurality of data storage units connected to a backplane of the server through a plurality of connectors. Each connector is fixed on the backplane with two screws. Thus, assembling and disassembling the connectors can be inconvenient.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
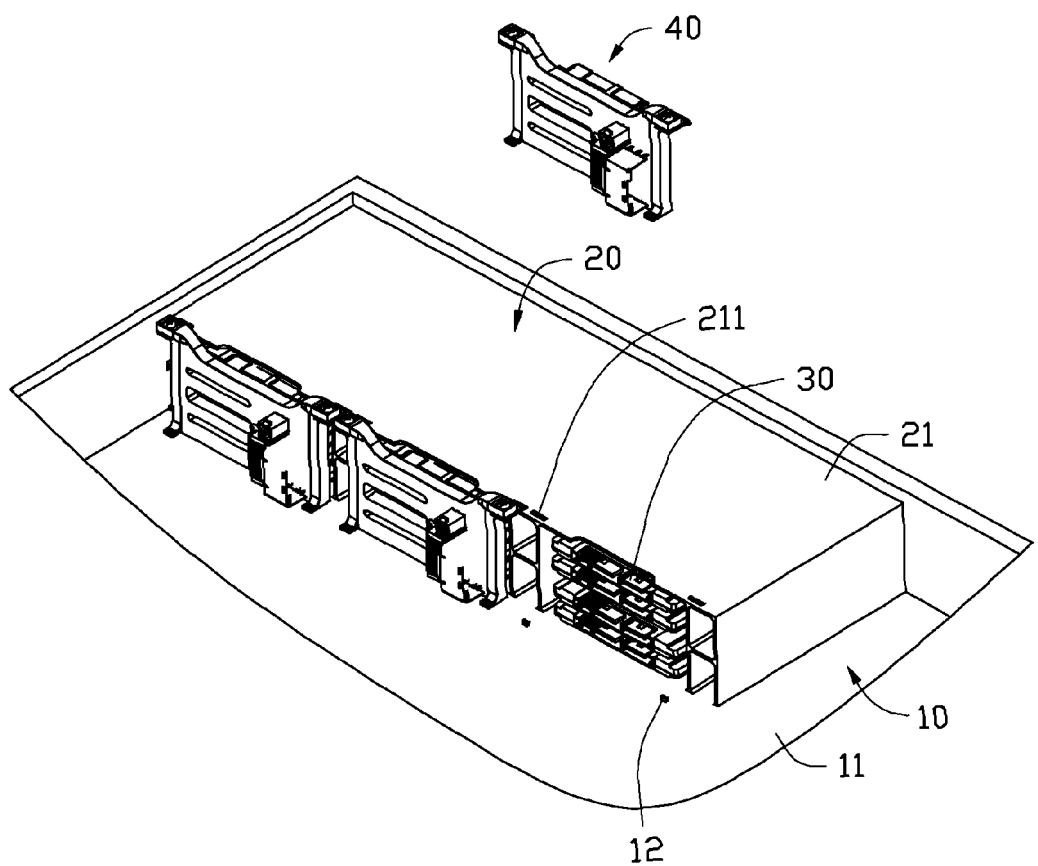
FIG. 1 is an exploded, isometric view of an embodiment of an electronic device, wherein the electronic device includes a connector module.

Referring to FIG. 1, an embodiment of an electronic device includes a chassis 10, a bracket 20 received in the chassis 10, a plurality of data storage assemblies 30 received in the bracket 20, and a plurality of connector modules 40. In the embodiment, each data storage assembly 30 includes a plurality of hard disk drives.

The chassis 10 includes a bottom wall 11. The bracket 20 is fixed on the bottom wall 11. Two blocks 12 protrude on the bottom wall 11, aligning with a data storage assembly 30.

The bracket 20 includes a plurality of receiving spaces each receiving a data storage assembly 30. The bracket 20 includes a top plate 21 opposite to the bottom wall 11. Two locking holes 211 are defined in the top plate 21, corresponding to the two blocks 12.

Figure 2:
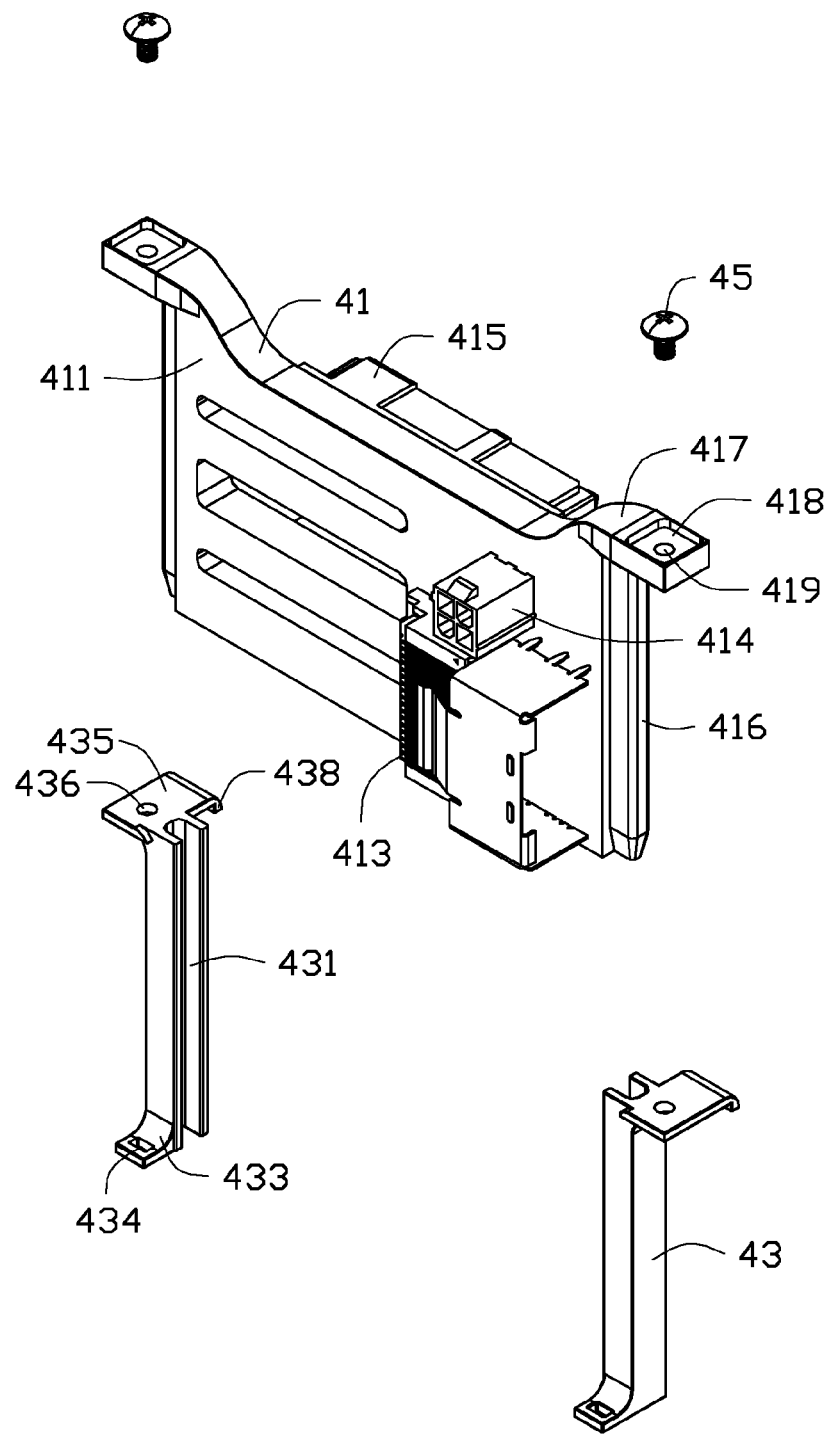
FIG. 2 is an exploded, enlarged view of the connector module of FIG. 1.
Figure 3:
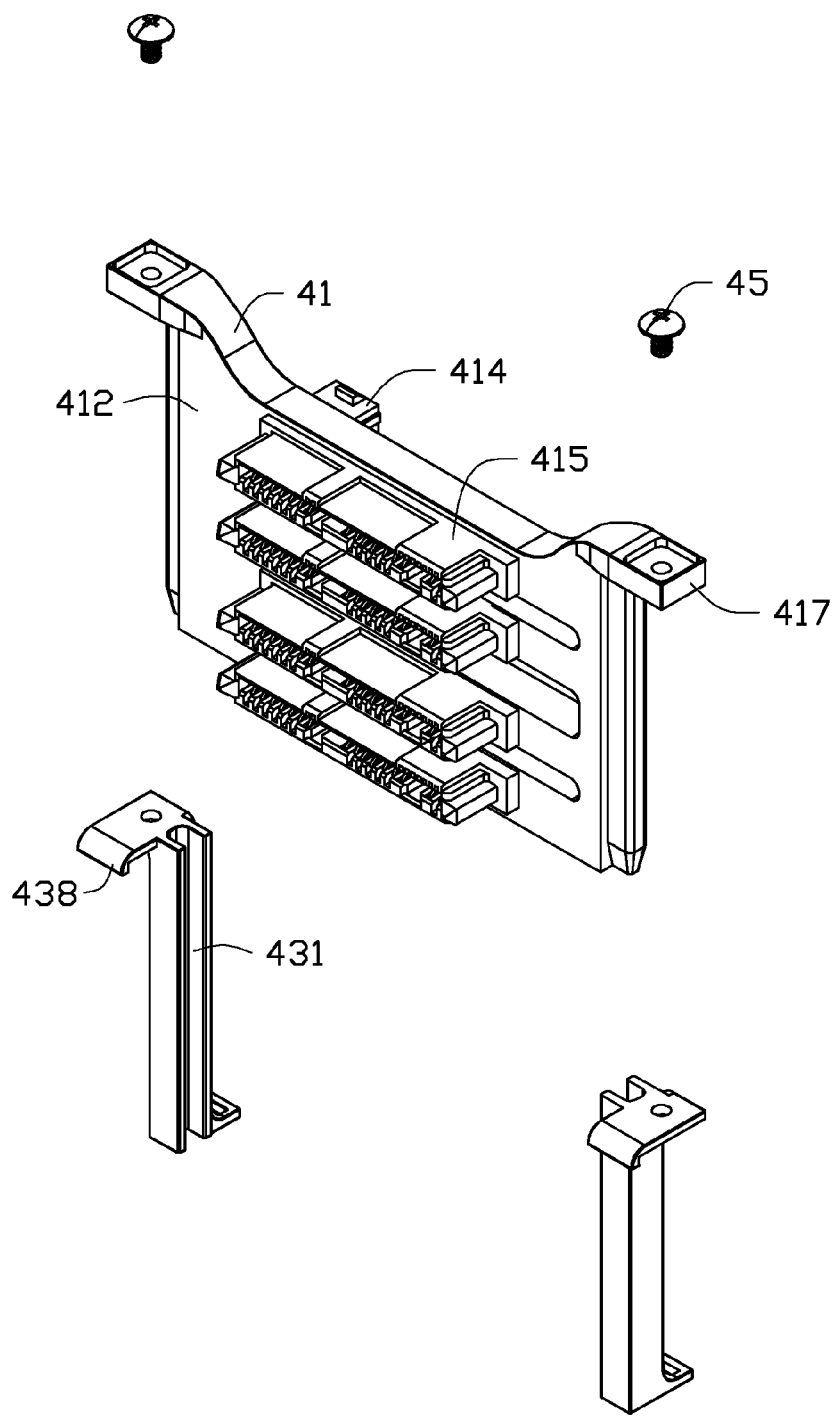
FIG. 3 is similar to FIG. 2, but viewed from another aspect.

Referring to FIG. 2 and FIG. 3, each connector module 40 includes a main body 41, two mounting members 43, and two screws 45. The main body 41 includes a first side surface 411 and a second side surface 412. A first signal connector 413 and a power connector 414 are set on the first side surface 411. The first signal connector 413 is a serial attached small computer system interface (SAS), for electrically connecting with a motherboard of the electronic device. A plurality of parallel second signal connectors 415 are set on the second side surface 412. The second signal connectors 415 are SAS, for electrically connecting with the data storage assemblies 30. Two rails 416 are formed from opposite end walls of the main body 41. A mounting piece 417 extends outward from a top of each rail 416. Each mounting piece 417 defines a depressed portion 418 and a through hole 419 in a center of the depressed portion 418.

Each mounting member 43 includes a locking portion 431 having a U-shaped cross-section and a groove define therein, a protrusion 433 formed from a bottom of a sidewall of the locking portion 431, and a mounting piece 435 formed from a top of the locking portion 431 opposite an opening of the locking portion 431. The protrusion 433 defines a locking 434. The mounting piece 435 defines a mounting hole 436. A flange 438 extends down from an end of the mounting piece 435.

Figure 4:
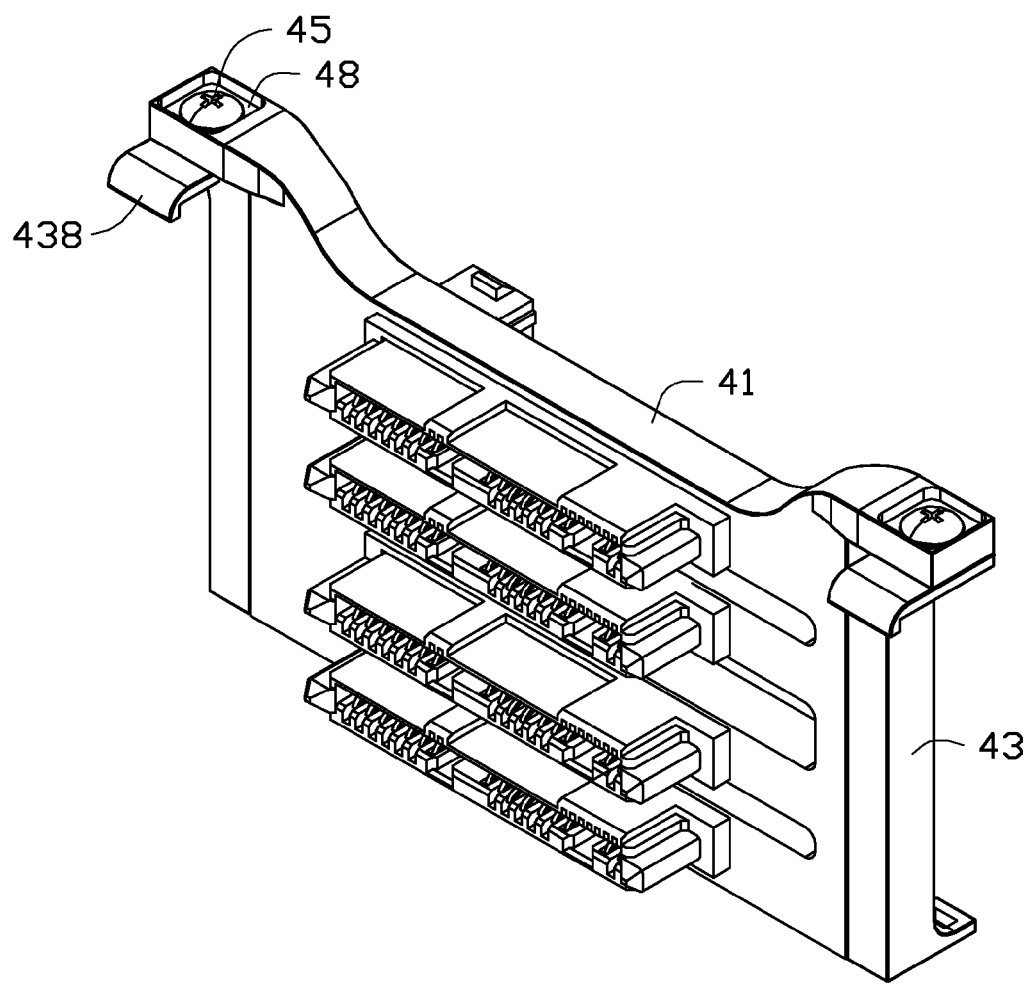
FIG. 4 is an assembled, isometric view of FIG. 3.

Referring to FIG. 4, in assembly, the connector module 40, the rails 416 respectively slide into the grooves of the locking portions 431, with the through holes 419 aligning with the mounting holes 436 respectively. Two screws 45 extend through the through holes 419 to screw into the mounting holes 436, respectively. The head of each screw 45 is received in the corresponding depressed portion 418.

Figure 5:
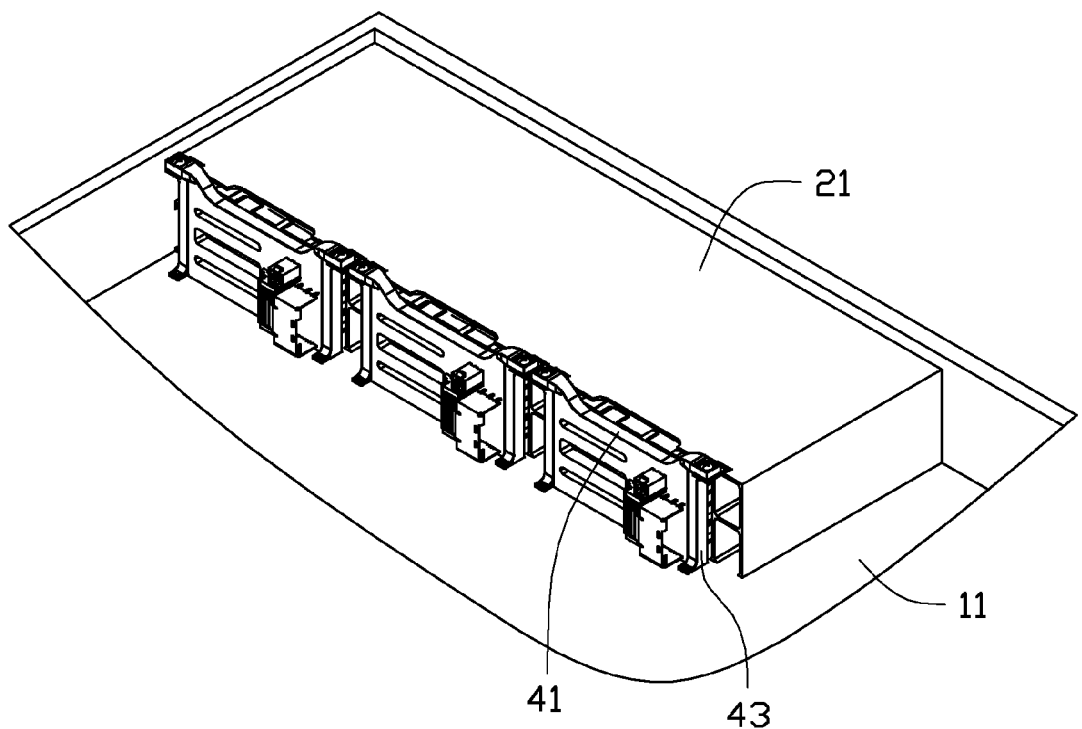
FIG. 5 is an assembled, isometric view of FIG. 1.

Referring to FIG. 5, in assembling the connector module 40 to the electronic device, the connector module 40 is positioned to align with the corresponding data storage assembly 30. The blocks 12 engage into the locking holes 434 respectively. The flanges 438 engage into the locking holes 211 respectively. Therefore, the connector module 40 is mounted to the bracket 20 aligning with the corresponding data storage assembly 30. The data storage assembly 30 is then inserted into the bracket 20 to connect with the second signal connectors 415.

In the embodiment, the connector module 40 are convenient to be mounted to or detached from the bracket 20 through manipulating the main body 41 and the mounting members 43.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An electronic device, comprising:
    a chassis comprising a bottom wall;
    a bracket fixed to the bottom wall, the bracket comprising a top plate opposite to the bottom wall of the chassis, the top plate defining two locking holes, two blocks protruding on the bottom wall near the bracket corresponding to the two locking holes;
    a data storage assembly received in the bracket; and
    a connector module comprising a main body and two mounting members, wherein each of the mounting members comprises a locking portion, a protrusion formed from a bottom of the locking portion and defining a locking hole, and a mounting piece formed from a top of the locking portion, a flange extends down from an end of the mounting piece, the blocks engage into the locking holes of the mounting members respectively, the flanges engage into the locking holes of the top plate respectively, such that the connector module is mounted to the bracket aligning with the data storage assembly; the main body is slidably positioned between locking portions of the mounting members and comprises a first side surface and a second side surface, a first signal connector and a power connector are set on the first side surface, the first signal connector is to electrically connect with a motherboard of the electronic device, the power connector is to connect with a power supply, a plurality of second signal connectors are set on the second side surface, to electrically connect with the data storage assembly.

2. The electronic device of claim 1, wherein each of the locking portions has a U-shaped cross-section, two rails are formed from opposite end walls of the main body, and slidably inserted into the locking portions respectively.

3. The electronic device of claim 2, wherein a mounting piece extends outward from a top of each of the rails, each of the mounting pieces of the main body defines a depressed portion and a through hole in a center of the depressed portion, each of the mounting pieces of the mounting members defines a mounting hole, two screws extend through the through holes of the main body to screw into the mounting holes of the mounting members respectively.

4. The electronic device of claim 3, wherein the heads of the screws are received in the depressed portions of the main body, respectively.

5. The electronic device of claim 1, wherein the first signal connector is a serial attached small computer system interface.

6. The electronic device of claim 1, wherein the second signal connectors are serial attached small computer system interfaces.

* * * * *